(12) United States Patent
Fang et al.

(10) Patent No.: US 9,385,278 B2
(45) Date of Patent: Jul. 5, 2016

(54) SEMICONDUCTOR GROWTH SUBSTRATES AND ASSOCIATED SYSTEMS AND METHODS FOR DIE SINGULATION

(71) Applicant: Micron Technology, Inc., Boise, ID (US)

(72) Inventors: Xiaolong Fang, San Jose, CA (US); Lifang Xu, Boise, ID (US); Tingkai Li, Camas, WA (US); Thomas Gehrke, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/617,423

(22) Filed: Feb. 9, 2015

(65) Prior Publication Data

US 2015/0155440 A1 Jun. 4, 2015

Related U.S. Application Data

(62) Division of application No. 13/349,432, filed on Jan. 12, 2012, now Pat. No. 8,951,842.

(51) Int. Cl.
| | |
|---|---|
| *H01L 33/32* | (2010.01) |
| *H01L 33/48* | (2010.01) |
| *H01L 21/66* | (2006.01) |
| *H01L 23/544* | (2006.01) |
| *H01L 33/00* | (2010.01) |
| *H01L 21/78* | (2006.01) |

(52) U.S. Cl.
CPC ............. *H01L 33/32* (2013.01); *H01L 22/10* (2013.01); *H01L 22/32* (2013.01); *H01L 22/34* (2013.01); *H01L 23/544* (2013.01); *H01L 33/007* (2013.01); *H01L 33/0066* (2013.01); *H01L 33/0095* (2013.01); *H01L 33/48* (2013.01); *H01L 21/78* (2013.01); *H01L 2924/0002* (2013.01)

(58) Field of Classification Search
CPC ..... H01L 33/504; H01L 33/50; H01L 33/544; H01L 21/78; H01L 23/544; H01L 33/32; H01L 33/48
USPC .......................................................... 257/13
See application file for complete search history.

(56) References Cited

U.S. PATENT DOCUMENTS

| | | | |
|---|---|---|---|
| 6,331,208 B1 | 12/2001 | Nishida et al. | |
| 6,521,975 B1 * | 2/2003 | West ..................... | H01L 23/562 257/508 |
| 7,554,139 B2 | 6/2009 | Inoue et al. | |
| 7,564,095 B2 | 7/2009 | Urakami et al. | |
| 8,242,025 B2 * | 8/2012 | Kawashima ........ | H01L 21/8221 257/E21.214 |
| 8,575,634 B2 * | 11/2013 | Liu .................... | H01L 21/76898 257/98 |

(Continued)

*Primary Examiner* — Nathan Ha
(74) *Attorney, Agent, or Firm* — Perkins Coie LLP

(57) ABSTRACT

Semiconductor growth substrates and associated systems and methods for die singulation are disclosed. A representative method for manufacturing semiconductor devices includes forming spaced-apart structures at a dicing street located between neighboring device growth regions of a substrate material. The method can further include epitaxially growing a semiconductor material by adding a first portion of semiconductor material to the device growth regions and adding a second portion of semiconductor material to the structures. The method can still further include forming semiconductor devices at the device growth regions, and separating the semiconductor devices from each other at the dicing street by removing the spaced-apart structures and the underlying substrate material at the dicing street.

20 Claims, 9 Drawing Sheets

(56) References Cited

U.S. PATENT DOCUMENTS

| | | | |
|---|---|---|---|
| 8,642,447 B2* | 2/2014 | Itou | H01L 21/78 257/618 |
| 2006/0012012 A1* | 1/2006 | Wang | H01L 23/562 257/620 |
| 2006/0157797 A1 | 7/2006 | Tateshita | |
| 2006/0192270 A1* | 8/2006 | Uchiyama | G03F 9/7076 257/620 |
| 2010/0096732 A1* | 4/2010 | Koubuchi | G03F 9/7076 257/620 |
| 2010/0197114 A1 | 8/2010 | Jeng et al. | |
| 2011/0073889 A1 | 3/2011 | Sugizaki et al. | |
| 2011/0085578 A1 | 4/2011 | Tokunaga et al. | |
| 2011/0156074 A1 | 6/2011 | Liu et al. | |
| 2011/0156191 A1 | 6/2011 | Lin et al. | |
| 2011/0180122 A1 | 7/2011 | Tanner et al. | |
| 2012/0187427 A1 | 7/2012 | Chandra | |
| 2013/0075869 A1* | 3/2013 | Mackh | H01L 21/78 257/620 |
| 2013/0181219 A1 | 7/2013 | Fang et al. | |
| 2013/0181329 A1* | 7/2013 | Wada | H01L 23/562 257/620 |

* cited by examiner

US 9,385,278 B2

SEMICONDUCTOR GROWTH SUBSTRATES AND ASSOCIATED SYSTEMS AND METHODS FOR DIE SINGULATION

CROSS REFERENCE TO RELATED APPLICATION

This application is a divisional of U.S. application Ser. No. 13/349,432 filed Jan. 12, 2012, now U.S. Pat. No. 8,951,842, which is incorporated herein by reference in its entirety.

TECHNICAL FIELD

The present technology is directed generally to semiconductor growth substrates and associated systems and methods for die singulation.

BACKGROUND

Solid state transducer ("SST") devices are used in a wide variety of products and applications. For example, mobile phones, personal digital assistants ("PDAs"), digital cameras, MP3 players, and other portable electronic devices utilize SST devices for backlighting. SST devices are also used for signage, indoor lighting, outdoor lighting, and other types of general illumination. SST devices generally use light emitting diodes ("LEDs"), organic light emitting diodes ("OLEDs"), and/or polymer light emitting diodes ("PLEDs") as sources of illumination, rather than electrical filaments, plasma, or gas. FIG. 1A is a cross-sectional view of a conventional SST device 10a with lateral contacts. As shown in FIG. 1A, the SST device 10a includes a substrate 20 carrying an LED structure 11 having an active region 14, e.g., containing gallium nitride/indium gallium nitride (GaN/InGaN) multiple quantum wells ("MQWs"), positioned between N-type GaN 15 and P-type GaN 16. The SST device 10a also includes a first contact 17 on the P-type GaN 16 and a second contact 19 on the N-type GaN 15. The first contact 17 typically includes a transparent and conductive material (e.g., indium tin oxide ("ITO")) to allow light to escape from the LED structure 11. In operation, electrical power is provided to the SST device 10a via the contacts 17, 19, causing the active region 14 to emit light.

FIG. 1B is a cross-sectional view of another conventional LED device 10b in which the first and second contacts 17 and 19 are opposite each other, e.g., in a vertical rather than lateral configuration. During formation of the LED device 10b, a growth substrate (not shown), similar to the substrate 20 shown in FIG. 1A, initially carries an N-type GaN 15, an active region 14 and a P-type GaN 16. The first contact 17 is disposed on the P-type GaN 16, and a carrier 21 is attached to the first contact 17. The growth substrate is removed, allowing the second contact 19 to be disposed on the N-type GaN 15. The structure is then inverted to produce the orientation shown in FIG. 1B. In the LED device 10b, the first contact 17 typically includes a reflective and conductive material (e.g., silver or aluminum) to direct light toward the N-type GaN 15. An optional converter material and an encapsulant can then be positioned over one another on the LED structure 11. In operation, the LED structure 11 can emit energy at a first wavelength (e.g., blue light) that stimulates the converter material (e.g., phosphor) to emit energy at a second wavelength (e.g., yellow light). Energy at the first and second wavelengths is combined to generate a desired color of light (e.g., white light).

One drawback associated with the foregoing techniques is that growing semiconductor materials to produce the LED structure 11 can be difficult to perform in a uniform fashion. For example, at least some conventional techniques tend to produce an uneven distribution of semiconductor material on the growth substrate. This in turn can cause non-uniformities in the subsequent manufacturing steps used to produce the SST devices, and/or non-uniformities in the light production and/or other characteristics of the SST devices. Accordingly, there remains a need for improved SST device manufacturing techniques.

DETAILED DESCRIPTION

Specific details of several semiconductor growth substrates and associated systems and methods for die singulation are described below. In particular embodiments, the die singulation techniques described below are performed on solid state transducer (SST) dies and devices. The term "SST" generally refers to solid state transducers or other devices that include a semiconductor material as the active medium to convert between electrical energy and electromagnetic radiation in the visible, ultraviolet, infrared, and/or other spectra. For example, SST devices include solid state light emitters (e.g., LEDs, laser diodes, etc.) and/or other sources of emission other than electrical filaments, plasmas, or gasses. The term SST can also include solid state devices that convert electromagnetic radiation into electricity. Additionally, depending upon the context in which it is used, the term "substrate" can refer to a wafer-level substrate or to a singulated device-level substrate. A person skilled in the relevant art will also understand that the technology may have additional embodiments, and that the technology may be practiced without several of the details of the embodiments described below with reference to FIGS. 2A-5.

Figure 2A:
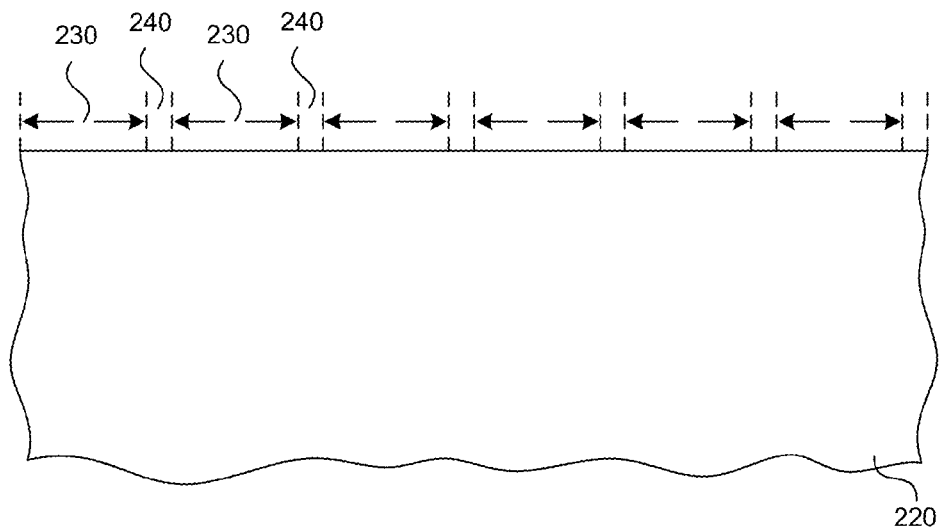
FIGS. 2A-2G illustrate a process for forming dies in accordance with an embodiment of the present technology.

FIG. 2A is a partially schematic, cross-sectional illustration of a growth substrate 220 suitable for epitaxially growing materials used to form SST devices and/or other semiconductor devices. The techniques for growing materials can include selective area epitaxial growth (SAG), epitaxial lateral overgrowth (ELOG), lateral epitaxial overgrowth (LEO), and pendeo-epitaxy. These techniques are typically used to form thin films from elements in Groups III and V of the periodic table. The growth substrate 220 can have the form of a wafer and can include multiple device growth regions 230 at which the semiconductor devices are formed. Street regions 240 are positioned between neighboring device growth regions 230.

The street regions 240 provide spaces between the neighboring device growth regions 230 that accommodate the tools and processes used to separate the SST devices formed at these regions. Aspects of the present technology are directed to forming spaced-apart structures, e.g., "dummy" or sacrificial structures, at the street regions 240 to improve the uniformity with which materials are grown or otherwise formed at the device growth regions 230, as will be described in further detail below.

In a particular embodiment, the growth substrate 220 can include silicon or another substrate material (e.g., an engineered substrate) suitable for growing gallium nitride and/or gallium nitride compounds that are typically used to form SST devices. In other embodiments, the growth substrate 220 can include other suitable materials depending upon the nature of the materials grown on it. In general, the growth substrate 220 is itself crystalline and supports the growth of a crystalline material. In many instances, the lattice structure and/or coefficient of thermal expansion (CTE) of the growth substrate 220 is different than that of the material formed on it. Either or both of these differences can create stresses in the materials formed on the growth substrate 220 and can adversely affect the resulting dies and/or the processes for forming the dies. For example, the stresses can cause substrate wafers to "bow," which interferes with subsequent process steps and/or with the uniformity of the resulting devices. Accordingly, in addition to or in lieu of improving the uniformity with which growth materials are formed on the growth substrate 220, the dummy structures described below can reduce stress build-up in such materials by interrupting an otherwise continuous material layer.

Figure 2B:
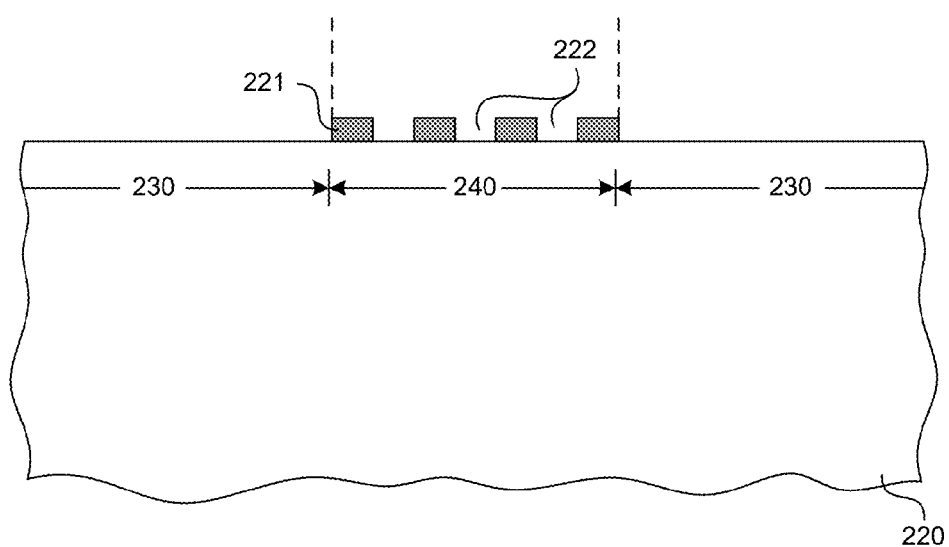

FIG. 2B is an enlarged, partially schematic, cross-sectional illustration of a portion of the growth substrate 220 shown in FIG. 2A. In FIG. 2B, a mask 221 has been applied to the illustrated street regions 240 (one of which is visible in FIG. 2B). The mask 221 can include apertures 222 at which dummy structures will be formed during subsequent processing steps.

Figure 2C:
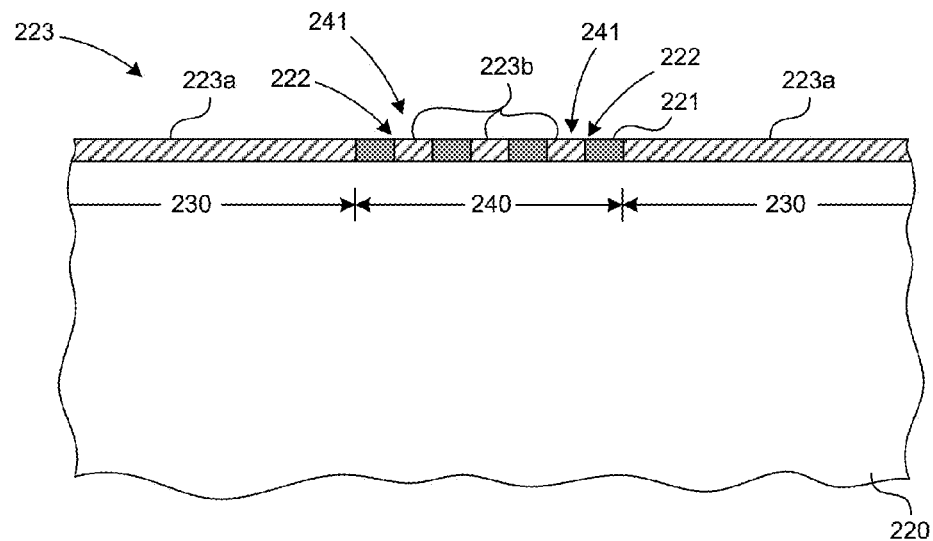

FIG. 2C illustrates an embodiment of the growth substrate 220 described above with reference to FIG. 2B after a seed material 223 has been disposed on it. The seed material 223 can include first portions 223a at the device growth regions 230, and second portions 223b at the street region 240. At the street region 240, the second portions 223b of the seed material 223 are disposed in the apertures 222 of the mask 221. Accordingly, the second portions 223b can support additional materials that together form dummy structures 241 at the street region 240. In a particular embodiment, the seed material 223 includes aluminum nitride, and in other embodiments, the seed material 223 can include other suitable elements or compounds. The seed material 223 can be deposited and/or processed to be co-planar with the adjacent mask 221, as shown in FIG. 26, or it can be recessed below or extend above the mask 221.

Figure 2D:
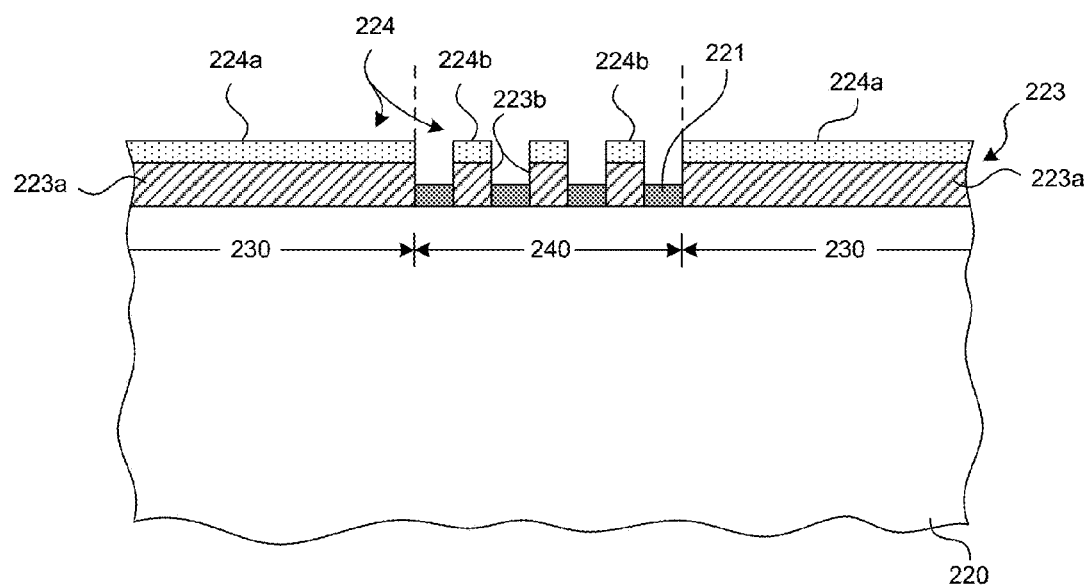

In FIG. 2D, a first semiconductor material 224 has been disposed on the growth substrate 220. Accordingly, the first semiconductor material 224 can include first portions 224a at the device growth regions 240, and one or more second portions 224b at the street region 240. In one aspect of this embodiment, the mask 221 can remain in place during this process (and ensuing processes), and in other embodiments, the mask 221 can be removed, e.g., if doing so does not cause bridging between adjacent dummy structures during subsequent processing steps. In any of these embodiments, the first semiconductor material 224 is disposed on the first portion 223a of the seed material 223 at the device growth regions 230, and on the second portions 223b of the seed material 223 and the street region 240. The first semiconductor material 223 can include an undoped or unintentionally doped gallium nitride material (u-GaN) and/or another material suitable for growing additional material volumes used to form the resulting SST or other device. In other embodiments, the first semiconductor material 224 can be eliminated, and other suitable materials (e.g., the second semiconductor material described further below) can be disposed directly on the seed material 223. In still further embodiments, the seed material 223 can be eliminated and an appropriate semiconductor material can be disposed directly on the growth substrate 220. In any of these embodiments, the first semiconductor material 224 and/or other materials carried by the growth substrate 220 can be disposed using any of a variety of suitable techniques, including, but not limited to, chemical vapor deposition (CVD), physical vapor deposition (PVD) and atomic layer deposition (ALD). In any of these embodiments, the first portions 224a can form or define first exposed surfaces at the device growth regions 240, and the second portions 224b can form or define second exposed surfaces at the spaced-apart structures 241. The spaced-apart structures 241 can accordingly attract material that would otherwise be disposed at the growth regions 240.

Figure 2E:
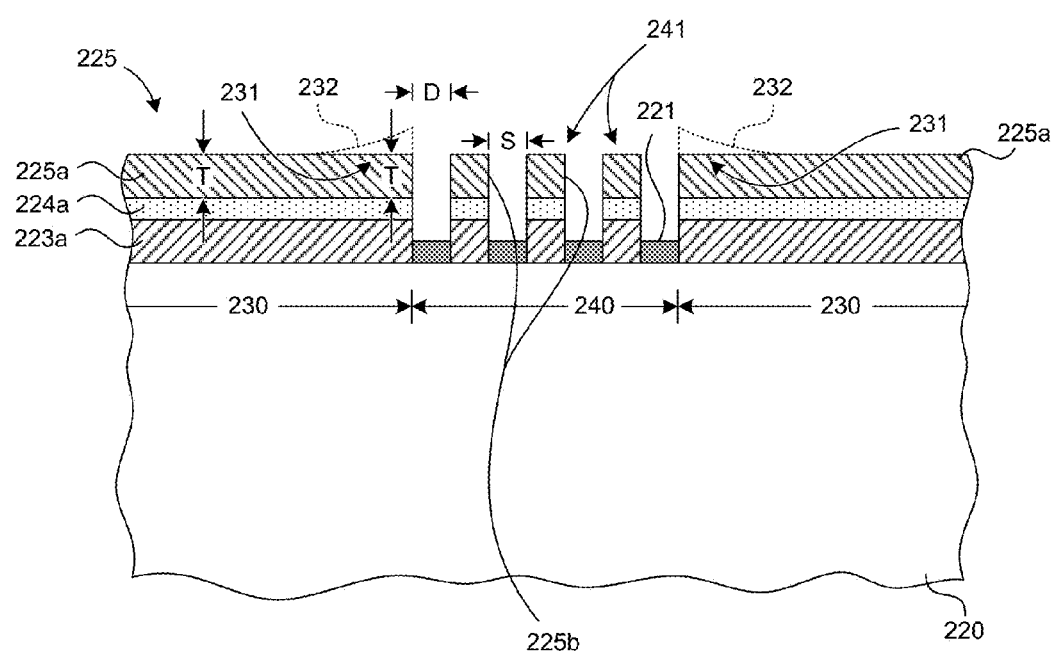

In FIG. 2E, a second semiconductor material 225 has been disposed on the growth substrate 220. In particular, first portions 225a of the second semiconductor material 225 have been disposed at the device growth regions 230, and second portions 225b of the second semiconductor material 225 have been disposed at the street region 240. In particular embodiments, the second semiconductor material 225 can include silicon gallium nitride (Si—GaN) or another N-type GaN material. In other embodiments, the second semiconductor material 225 can include other elements or compounds.

As shown in FIG. 2E, the second portion 225a of the second semiconductor material 225 can have a generally uniform thickness, e.g., the same or generally the same thickness at both an edge region 231 (adjacent to the street region 240) and at positions spaced further away from the street region 240. This is unlike existing processes which generally form edge structures 232 (shown in dotted lines) projecting away from the growth substrate 220 at the edge regions 231. These conventional processes include depositing a dielectric material at the street region 240 to prevent the first semiconductor material 224 and/or the second semiconductor material 225 from growing or otherwise forming at the street regions 240. This conventional step is taken to prevent the first and/or second semiconductor materials 224, 225 from forming layers that extend laterally (left/right and into/out of the plane of FIG. 2E) over long uninterrupted distances. Formation of the first or second semiconductor materials over an uninterrupted distance can increase stress on the growth substrate and may result in wafer bowing or other types of deformation than are layers having smaller lateral extents. In a conventional arrangement, the dielectric material at the street regions 240 inhibits the semiconductor materials from nucleating there and accordingly interrupts the lateral extension of these materials. However, as a result of preventing the first and/or semiconductor materials 224, 225 from forming at the street regions 240, conventional techniques can force the material that would otherwise nucleate in the street regions 240 to form the edge structures 232 at the edge regions 231 of the device growth regions 230. Instead of forming such edge structures 232, embodiments of the present technology include the dummy structures 241 positioned at the street region 240 to attract at least some of the second semiconductor material 225 (e.g., atoms or molecules) that would otherwise be disposed at the edge region 231. Accordingly, the exposed surfaces of the dummy structures 241 can have the same composition as the exposed surfaces at the device growth regions 230. The dummy structures 241 can accordingly prevent the edge structures 232 from forming and can therefore improve the uniformity with which the second semiconductor material 225 and materials supported and/or carried by the second semiconductor material 225 are formed.

Figure 1A:
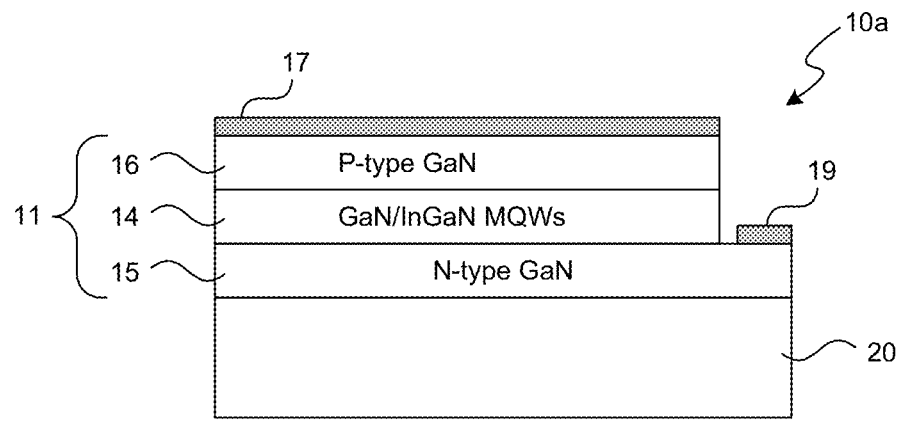
FIG. 1A is a partially schematic, cross-sectional diagram of an SST device having a lateral arrangement in accordance with the prior art.
Figure 1B:
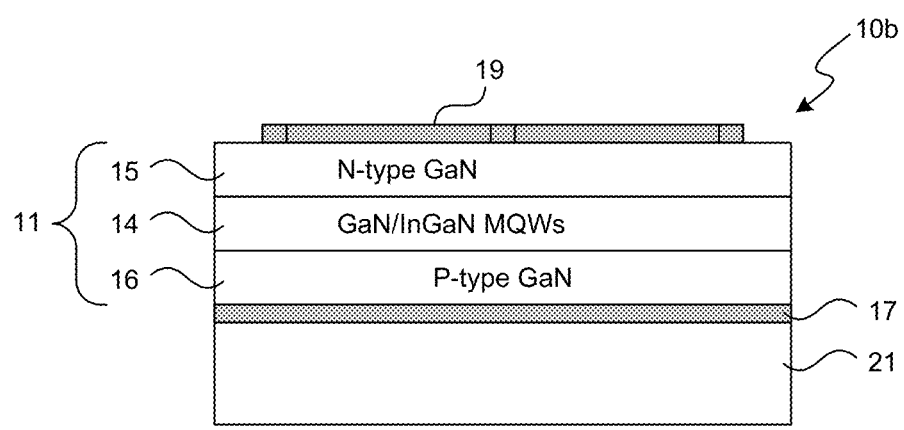
FIG. 1B is a partially schematic, cross-sectional diagram of another SST device having a vertical arrangement in accordance with the prior art.

The dummy structures 241 can be sized, shaped and spaced to attract growth materials in the manner described above. For example, the dummy structures 241 closest to the device growth region 230 can be spaced apart from the device growth regions 230 by an offset distance D having a value of from about 5 microns to about 15 microns. In other embodiments, the offset distance D can have other values that produce dummy structures that are also (a) close enough to the device growth regions 230 to attract material that might otherwise form the edge structures 232, yet (b) far enough from the device growth regions 230 to avoid coalescing with these regions. Individual dummy structures 241 can be separated from each other by a separation distance S having a similar value to avoid coalescing. The selected values for the offset distance D and/or the separation distance S can depend upon the type of device being formed. For example, devices with a vertical configuration (generally shown in FIG. 1B) may not require values as large as those for devices with a lateral configuration (generally shown in FIG. 1A).

Figure 2F:
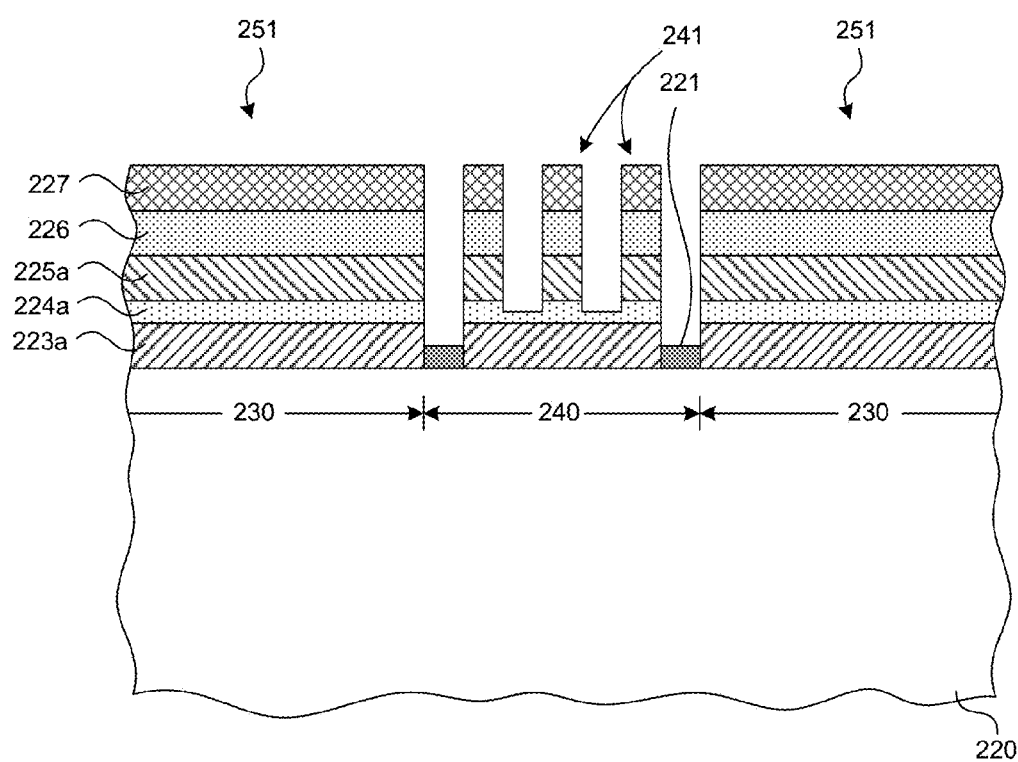
Figure 2G:
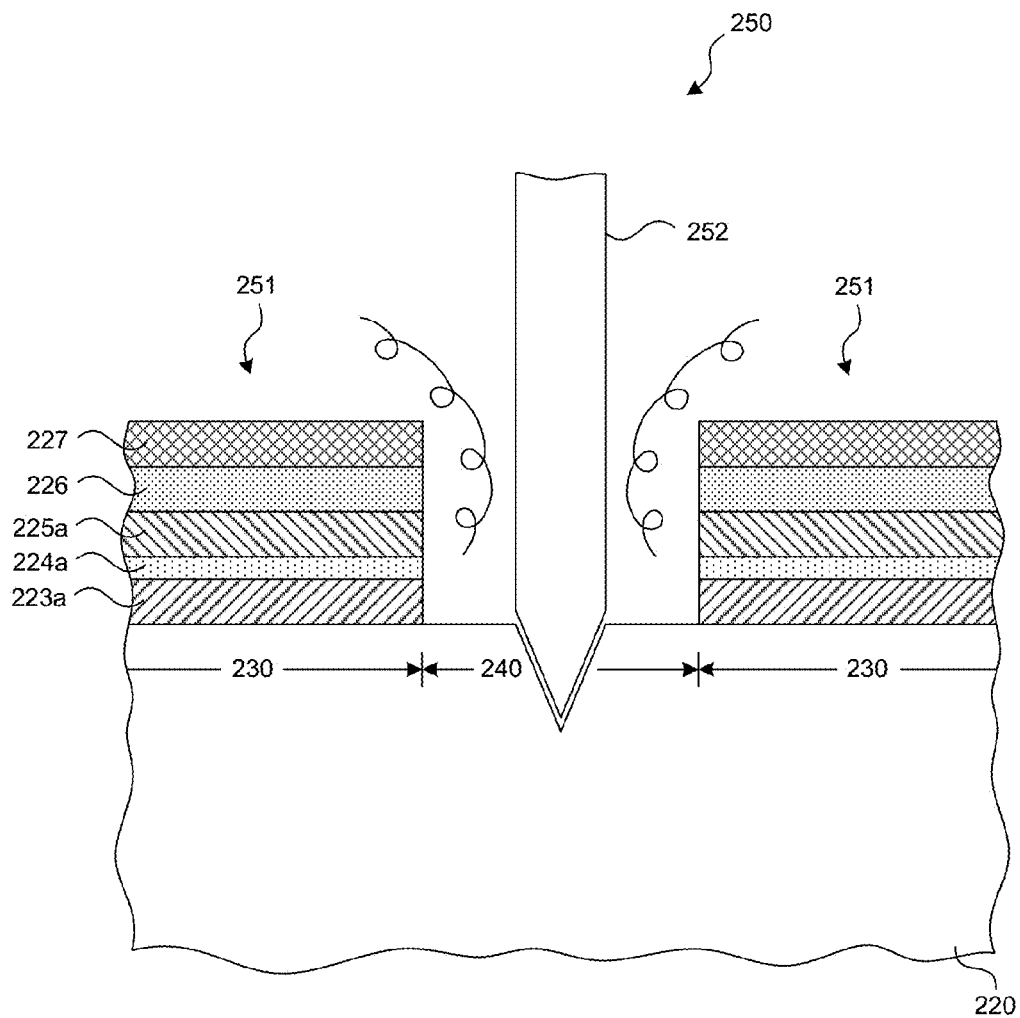

In FIG. 2F, additional materials have been disposed at the growth regions 230 to form corresponding dies 251. In particular embodiments, the additional materials can include an active region material 226 (e.g., a gallium nitride and a gallium nitride compound for example, indium gallium nitride) that form multiple quantum wells suitable for generating light. A third semiconductor material 227 (e.g., a P-type GaN material) is positioned adjacent the active region material 226 to form an electrical path through the active region material 226. Accordingly, the resulting dies 251 can be used to form LEDs or other SST devices. The additional materials 226, 227 are also disposed at the street region 240.

In particular embodiments, other processes may be performed on the dies 251 before they are singulated. Such processes can include forming interconnect structures, lenses, coatings, and/or other elements. In any of these embodiments, the dies 251 can then be separated using a singulation device 250, shown in FIG. 2G. The singulation device 250 can include a saw blade 252 that separates the dies 251 at the street regions 240, thus damaging, destroying, and/or otherwise modifying (e.g., in an irreversible manner) the dummy structures 241 (FIG. 2F) and other features formed at the street regions 240. Accordingly, the dummy structures can be sacrificial elements with no further purpose once the dies 251 have been singulated. In other embodiments, other techniques can be used to singulate the dies 251. Suitable techniques include laser dicing, cleave-and-break separation techniques, and/or others, which also typically damage or destroy the dummy structures. In any of these embodiments, the singulated dies can be further processed to form packages and/or other structures suitable for end users after the singulation operation has been performed.

Figure 3:
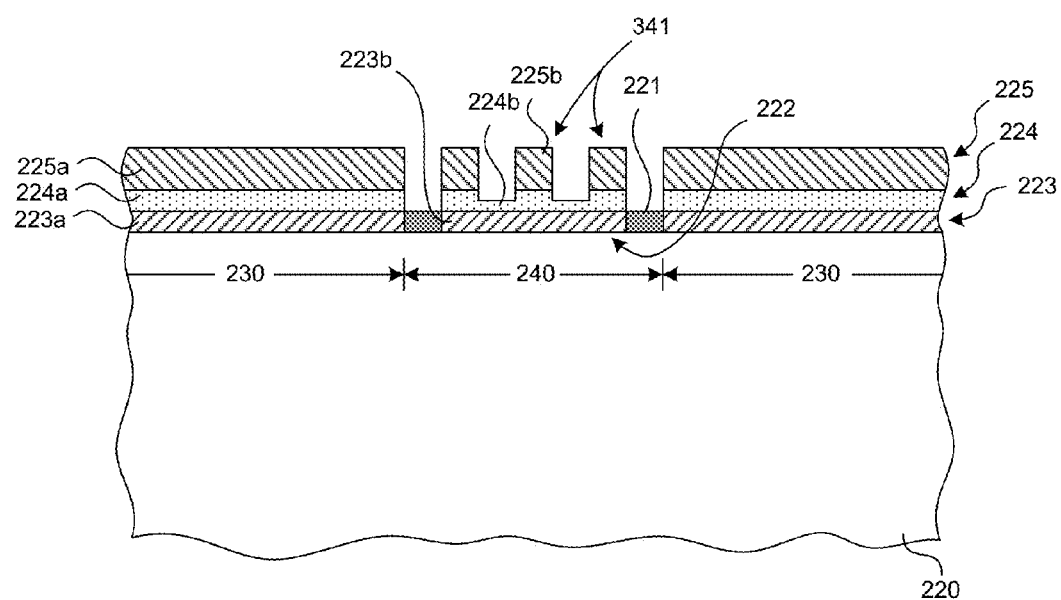
FIG. 3 is a partially schematic, cross-sectional side view of a structure having dies and an intermediate street region configured in accordance with another embodiment of the present technology.

FIG. 3 is a partially schematic, cross-sectional view of a growth substrate 220 supporting dummy structures 341 formed at a street region 240 in accordance with another embodiment of the present technology. In one aspect of this embodiment, the mask 221 includes a single aperture 222 in which the second portion 223b of the seed material 223 is disposed. The second material 224 can be disposed in a generally similar manner, forming a second portion 224b at the street region 240. The second portion 224b can be further processed (e.g., using a separate mask and etch process) to form recesses in the second portion 224b which then support multiple second portions 225b of the second material 225. The second portions 225b of the second material 225 form the corresponding dummy structures 341. Accordingly, a combination of additive and subtractive processes can be used to form the dummy structures 341. Once the dummy structures 341 are formed, the growth substrate 220 can be further processed, e.g., using the techniques described above with reference to FIG. 2F.

Figure 4A:
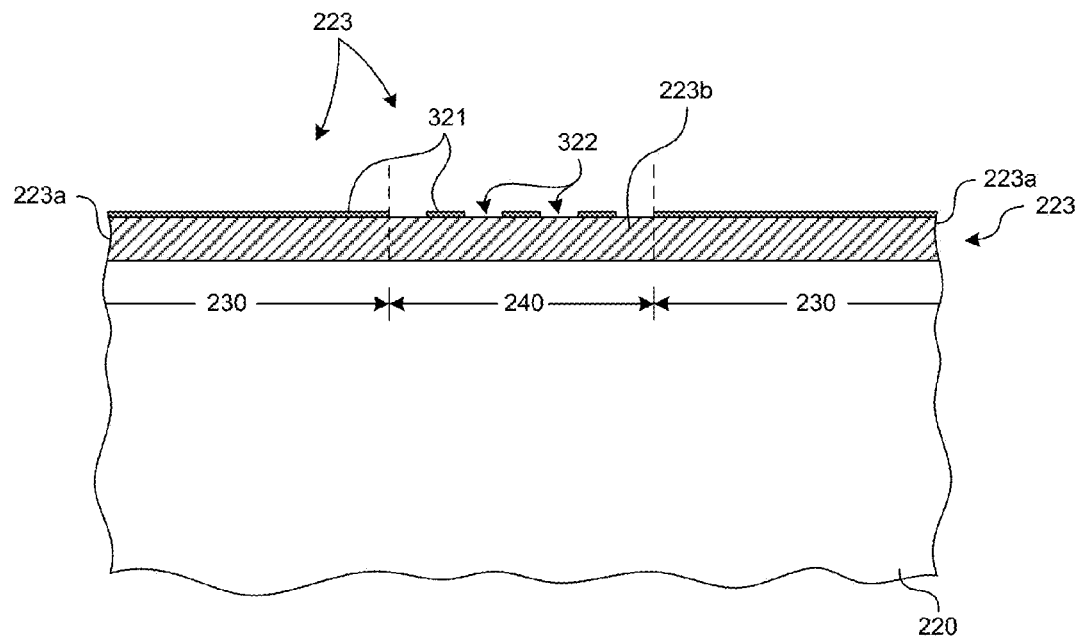
FIGS. 4A-4B illustrate a process for forming dummy structures using a subtractive process in accordance with an embodiment of the present technology.
Figure 4B:
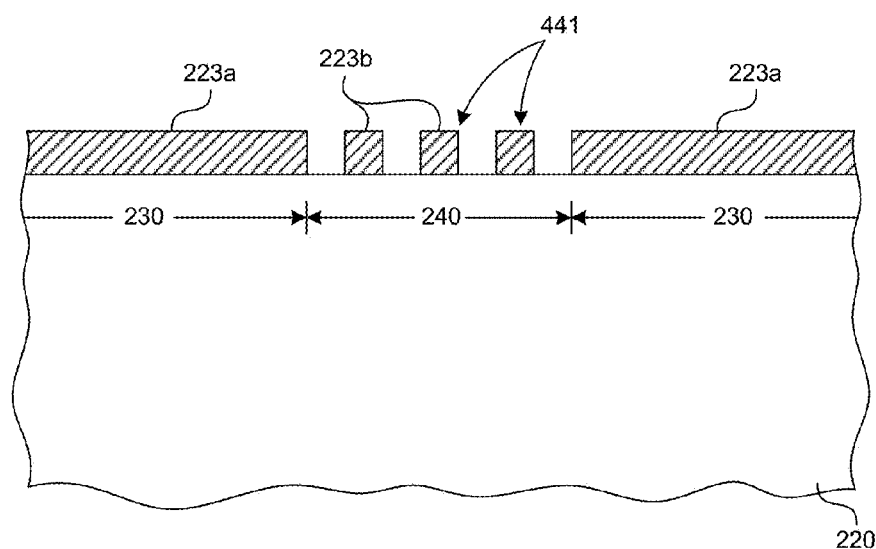

FIGS. 4A and 4B illustrate an arrangement in accordance with still another embodiment in which a subtractive process is used to form corresponding dummy structures 441. Beginning with FIG. 4A, the seed material 223 can be disposed in a generally continuous manner over both the device growth regions 230 and the street region 240, so that the first and second portions 223a, 223b are generally continuous. A mask 321 has been applied to the seed material 223 and includes apertures 322 in between dummy structure sites. A subtractive process (e.g., an etch process) is used to remove sections of the second portion 223b of the seed material 223, as shown in FIG. 4B. The remaining second portions 223b form the dummy structures 441. The remaining sections of the mask 321 (FIG. 4A) are removed to facilitate adding to the growth substrate 220 the additional materials described above with reference to FIGS. 2D-2F. In another embodiment, the masking process described above can operate in reverse. For example, the initially continuous mask 321 can be processed to have openings where mask material is shown in FIG. 4A, and mask material where openings are shown in FIG. 4A. Subsequently disposed materials will then form at the unmasked regions, producing growth at the growth regions 230 and producing spaced-apart dummy structures in the street region 240. In this embodiment, the seed material can include AlN, AlGaN, GaN and/or another suitable material, and the mask 221 can include $SiN_x$, $SiO_2$ or another suitable dielectric.

One feature of the foregoing embodiments is that the sacrificial, dummy structures can reduce or prevent epitaxially grown materials from over-accumulating at the edges of targeted growth regions. An advantage of this arrangement is that it can reduce or eliminate the extent to which such over-accumulations interfere with subsequent processes. Such processes can include photolithographic processes and subsequent growth processes, both of which benefit from and in many cases require very flat, uniform underlying layers. At the same time, the foregoing techniques do not require additional semiconductor "real estate" because the dummy structures can be formed within the confines of existing street widths.

Figure 5:
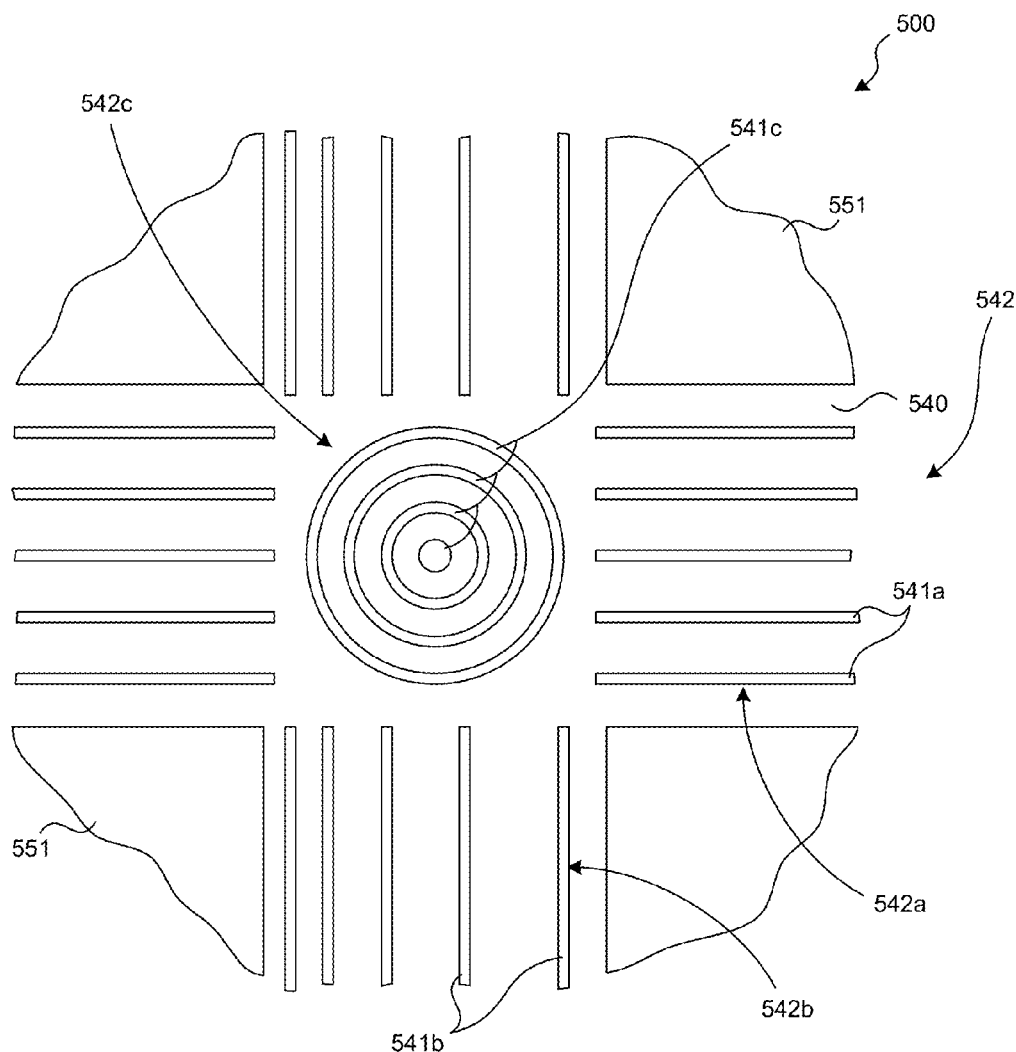
FIG. 5 is a partially schematic, top view of a plurality of dies separated by streets having test structures that can also function as dummy structures in accordance with yet another embodiment of the present technology.

FIG. 5 is a partially schematic plan view of a portion of a wafer 500 having representative dies 551 separated by dummy structures that, in addition to attracting material that would otherwise accumulate at the corresponding growth regions, form test structures 542. For purposes of illustration, multiple test structures 542 having different arrangements (e.g., first test structures 542a, second test structures 542b, and third test structures 542c) are illustrated as being carried by the same wafer 500. During typical processing steps, not all such test structures need be included in a single wafer or other growth substrate.

The test structures 542 can be used to conduct any of a number of pre-dicing diagnostic tasks, including, without limitation, testing electrical characteristics (e.g., impedance) and/or material doping levels. The first test structure 542a can include first dummy structures 541a that form spaced-apart transmission line elements suitable for transmission line measurement (TLM) techniques used to identify the electrical characteristics of the materials forming both the first dummy structures 541a and the corresponding structures at the dies 551. The first test structure 542a can include evenly spaced dummy structures 541a. The second test structure 542b can include corresponding dummy structures 541b that are spaced apart by different amounts. In still a further embodiment, a third test structure 542c can include dummy structures 541c that are arranged in concentric rings, e.g., to determine contact or sheet resistance.

In any of the foregoing embodiments, the results obtained from the test structures 542 can be used to influence downstream processes (prior to dicing). Accordingly, the dummy structures 541 can improve yield by improving the uniformity with which materials are grown on the growth substrate, and facilitating processes for correcting non-uniformities or other defects or anomalies.

From the foregoing, it will be appreciated that specific embodiments of the disclosed technology have been described herein for purposes of illustration, but that various modifications may be made without deviating from the technology. For example, the foregoing techniques can be used to form SST devices (e.g., LEDs) or other devices that make use of crystalline materials grown on substrates having different lattice and/or CTE characteristics. Such devices can include power devices. Depending upon the embodiment, the dummy structures can have forms and shapes other than those described above. For example, the dummy structures can have the form of intermittent, spaced-apart line segments, or spaced-apart pillars. In other embodiments, the foregoing techniques can be applied to devices with Group II-IV or VI layers, or layers formed from other elements or compounds. The overall epitaxial growth techniques, e.g., SAG techniques, can be applied at the die level as discussed above and/or at scales larger or smaller than die scale.

Certain aspects of the technology described in the context of particular embodiments may be combined or eliminated in other embodiments. For example, the test structures shown in FIG. 5 can be formed using any of the techniques described above with reference to FIGS. 2A-4B. Further, while advantages associated with certain embodiments have been described in the context of those embodiments, other embodiments may also exhibit such advantages, and not all embodiments need necessarily exhibit such advantages to fall within the scope of the present technology. Accordingly, the present disclosure and associated technology can encompass other embodiments not expressly described or shown herein.

We claim:

1. A semiconductor device, comprising:
   a substrate material;
   a plurality of semiconductor growth regions carried by the substrate material, with individual semiconductor growth regions having a first exposed surface;
   a dicing street between neighboring semiconductor growth regions;
   a plurality of spaced-apart sacrificial structures in the dicing street, with individual sacrificial structures having a second exposed surface, wherein a composition of the first exposed surface and the second exposed surface is the same; and
   a nucleation-inhibition mask in the dicing street between a given one of the sacrificial structures and a given one of the semiconductor growth regions, wherein the nucleation-inhibiting mask is a dielectric.

2. The device of claim 1, further comprising:
   a first quantity of semiconductor material at the first exposed surface; and
   a second quantity of semiconductor material grown at the second exposed surface.

3. The device of claim 2 wherein the first quantity of semiconductor material has a generally uniform thickness.

4. The device of claim 1 wherein the growth regions include solid state transducers.

5. The device of claim 4 wherein the solid state transducers include LEDs.

6. The device of claim 1 wherein the growth regions include elements from Groups III and V of the periodic table of elements.

7. The device of claim 1 wherein the sacrificial structures include lines oriented generally parallel to a main axis of the street.

8. The device of claim 1 wherein the sacrificial structures include transmission line measurement elements.

9. The device of claim 2 wherein the first and second quantities of semiconductor material are epitaxially grown.

10. The device of claim 1 wherein the growth regions are unpatterned.

11. The device of claim 1 wherein an offset distance between the given one of the growth regions and the given one of the sacrificial structures is within a range from 5 microns to 15 microns.

12. The device of claim 1 wherein a separation distance between the given one of the sacrificial structures and another one of the sacrificial structures closest to the given one of the sacrificial structures is within a range from 5 microns to 15 microns.

13. The device of claim 1 wherein the sacrificial structures are positioned to attract material that would otherwise be deposited at edge portions of the growth regions.

14. The device of claim 1 wherein a composition of the first and second exposed surfaces is selected to attract a selectively deposited semiconductor material.

15. The device of claim 1 further comprising a test structure including the sacrificial structures.

16. The device of claim 1 wherein the sacrificial structures are evenly spaced-apart parallel lines.

17. The device of claim 1 wherein the sacrificial structures are unevenly spaced-apart parallel lines.

18. The device of claim 1 wherein the sacrificial structures are concentric rings.

19. The device of claim 1 wherein the sacrificial structures are pillars.

20. The device of claim 1 wherein:
   the growth regions are first solid state transducers; and
   the sacrificial structures are second solid state transducers.

* * * * *